(12) United States Patent
Hamano (10) Patent No.: US 12,154,872 B2
(45) Date of Patent: Nov. 26, 2024

(54) SEMICONDUCTOR DEVICE AND POWER AMPLIFIER

(71) Applicant: SUMITOMO ELECTRIC INDUSTRIES, LTD., Osaka (JP)

(72) Inventor: Koshi Hamano, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 507 days.

(21) Appl. No.: 17/652,187

(22) Filed: Feb. 23, 2022

(65) Prior Publication Data

US 2022/0293537 A1 Sep. 15, 2022

(30) Foreign Application Priority Data

Mar. 15, 2021 (JP) ................................. 2021-041318

(51) Int. Cl.
*H03F 3/187* (2006.01)
*H01L 23/66* (2006.01)
*H03F 3/24* (2006.01)

(52) U.S. Cl.
CPC ............. *H01L 23/66* (2013.01); *H03F 3/245* (2013.01); *H01L 2223/6611* (2013.01)

(58) Field of Classification Search
CPC ...................................... H03F 3/187
USPC ........................................... 330/307
See application file for complete search history.

(56) References Cited

U.S. PATENT DOCUMENTS

| 4,807,017 A * | 2/1989 | Ema ..................... H01L 23/5283 |
| | | 257/E23.152 |
| 9,165,923 B2 * | 10/2015 | Sugimoto ........... H01L 27/0207 |
| 2004/0164407 A1 | 8/2004 | Nakajima et al. |
| 2017/0179027 A1 * | 6/2017 | Kim ....................... H10B 43/40 |
| 2020/0235215 A1 | 7/2020 | Yamaguchi et al. |

FOREIGN PATENT DOCUMENTS

| JP | H04-125941 | 4/1992 |
| JP | H06-005849 | 1/1994 |
| JP | 2001-267564 | 9/2001 |
| JP | 2004-260364 | 9/2004 |
| JP | 2012-109825 | 6/2012 |
| WO | 2018/020549 | 2/2018 |

* cited by examiner

*Primary Examiner* — Henry Choe
(74) *Attorney, Agent, or Firm* — IPUSA, PLLC (57) ABSTRACT

A semiconductor device includes a gate electrode, first and second transistors arranged in a first direction, first and second drain wirings each connected to a corresponding drain region of the first and second transistors, first output wiring extending in a second direction orthogonal to the first direction and having one end connected to a portion adjacent to the second transistor of the first drain wiring, second output wiring extending in the second direction and having one end connected to a portion adjacent to the first transistor of the second drain wiring, third output wiring extending in the first direction and connected to the other end of the first output wiring and the other end of the second output wiring, and fourth output wiring connecting a center portion of the third output wiring to an output terminal.

6 Claims, 7 Drawing Sheets

SEMICONDUCTOR DEVICE AND POWER AMPLIFIER

CROSS-REFERENCE TO RELATED APPLICATIONS

This application claims priority to Japanese Patent Application No. 2021-041318 filed on Mar. 15, 2021, the entire contents of which are incorporated herein by reference.

BACKGROUND

1. Field of the Invention

The present disclosure relates to a semiconductor device and a power amplifier.

2. Description of the Related Art

In a field effect transistor formed on a GaAs substrate, an SiC substrate, or the like, the gate width can be increased without increasing a layout size by forming what is called a multi-finger type or fishbone-type gate electrode. In this case, shield electrodes are disposed between a gate transmission line wired from a gate pad to gate electrodes and respective drain electrodes, thereby improving a gain in a high-frequency region (for example, see Japanese Unexamined Patent Application Publication No. 4-125941).

Further, by providing a gate pad at the center of a transistor region and directly connecting gate electrodes to the gate pad, a delay of an electric signal between the gate electrodes is prevented (for example, see Japanese Unexamined Patent Application Publication No. 6-5849). Furthermore, by arranging the multi-finger type gate electrode so as to be shifted in an extending direction of the gate electrodes, heat dissipation is improved without increasing the distance between the gate electrodes (for example, see WO 2018/020549).

Here, a fishbone-type gate electrode or a fishbone-type transistor will be described. The term "fishbone" indicates a fish bone. A fish has a backbone connecting a head and a tail fin, and thin bones such as ribs that extend in opposite directions on a dorsal fin side and a ventral fin side and that are substantially perpendicular to the backbone. A gate electrode structure, in which gate electrodes corresponding to the thin bones are arranged on both sides across a gate wiring corresponding to the backbone with the gate wiring being arranged at a center, is referred to as a fishbone-type gate electrode. In addition, a structure, in which a source region and a drain region are disposed on both sides of each gate electrode such that the gate electrode is interposed between the source region and the drain region and a transistor cell is formed in each set of the gate electrode, the source region, and the drain region, is referred to as a fishbone-type transistor. The gate width of the fishbone-type transistor is the sum of the widths of the respective gate electrodes connected to the gate wiring.

SUMMARY

A semiconductor device according to one aspect of the present embodiment includes a first transistor including a first gate electrode, a first source region, and a first drain region, the first gate electrode extending in a first direction, the first source region and the first drain region being arranged in a second direction with the the first gate electrode being interposed between the first source region and the first drain region, and the second direction being orthogonal to the first direction, a second transistor arranged juxtaposed to the first transistor in the first direction and including a second gate electrode, a second source region, and a second drain region, the second gate electrode extending in the first direction, the second source region and the second drain region being arranged in the second direction with the second gate electrode being interposed between the second source region and the second drain region, a wiring distributing section connecting an input terminal to the first gate electrode and to the second gate electrode, a first drain wiring arranged on the first drain region and connected to the first drain region, a second drain wiring arranged on the second drain region and connected to the second drain region, and a wiring coupling section connecting the first drain wiring and the second drain wiring to an output terminal. The wiring distributing section includes a first input wiring connected to an end of the first gate electrode on a side facing away from the second transistor, a second input wiring connected to an end of the second gate electrode on a side facing away from the first transistor, and a third input wiring connecting the first input wiring and the second input wiring to the input terminal. The wiring coupling section includes a first output wiring extending in the second direction, one end of the first output wiring being connected to the first drain wiring on a side facing the second transistor, a second output wiring extending in the second direction, one end of the second output wiring being connected to the second drain wiring on a side facing the first transistor, a third output wiring extending in the first direction and connected to another end of the first output wiring and another end of the second output wiring, and a fourth output wiring connecting a center portion of the third output wiring to the output terminal.

BRIEF DESCRIPTION OF THE DIAGRAMS

DETAILED DESCRIPTION

In power amplifiers operating at a high frequency such as a millimeter wave band, there is a demand to improve an output power rather than a gain. In order to improve an output power, for example, in a transistor mounted on a power amplifier, it is necessary to minimize routing of a wiring from a drain from which a signal is output to an output terminal and to reduce loss of the output signal.

Therefore, it is desirable to reduce the size of a wiring coupling section connected to a drain, which is an output part of a transistor, thereby reducing loss of an output signal and increasing output power.

According to at least one embodiment of the present disclosure, the size of a wiring coupling section connected to a drain that is an output part of a transistor is reduced, thereby reducing loss of an output signal and increasing output power.

Description of Embodiments of the Present Disclosure

First, embodiments of the present disclosure will be listed and described.

[1] A semiconductor device according to an embodiment of the present disclosure includes a first transistor including a first gate electrode extending in a first direction, and a first source region and a first drain region that are arranged in a second direction orthogonal to the first direction with the first gate electrode being interposed between the first source region and the first drain region; a second transistor arranged juxtaposed to the first transistor in the first direction and including a second gate electrode extending in the first direction, and a second source region and a second drain region that are arranged in the second direction with the second gate electrode being interposed between the second source region and the second drain region; a wiring distributing section connecting an input terminal to the first gate electrode and to the second gate electrode; a first drain wiring arranged on the first drain region and connected to the first drain region; a second drain wiring arranged on the second drain region and connected to the second drain region; and a wiring coupling section connecting the first drain wiring and the second drain wiring to an output terminal. The wiring distributing section includes a first input wiring connected to an end of the first gate electrode on a side facing away from the second transistor; a second input wiring connected to an end of the second gate electrode on a side facing away from the first transistor; and a third input wiring connecting the first input wiring and the second input wiring to the input terminal. The wiring coupling section includes a first output wiring extending in the second direction, one end of the first output wiring being connected to the first drain wiring on a side facing the second transistor; a second output wiring extending in the second direction, one end of the second output wiring being connected to the second drain wiring on a side facing the first transistor; a third output wiring extending in the first direction and connected to another end of the first output wiring and another end of the second output wiring; and a fourth output wiring connecting a center portion of the third output wiring to the output terminal.

In this semiconductor device, an electrical length of the third output wiring that connects the first output wiring, connected to the first drain region through the first drain wiring, and the second output wiring, connected to the second drain region through the second drain wiring, can be shortened. This can reduce loss of an output signal from the semiconductor device, and can increase an output power of the semiconductor device. In other words, by reducing the size of the wiring coupling section connected to the drain, which is an output part of the transistor, loss of the output signal from the semiconductor device can be reduced and the output power can be increased.

[2] In the above [1], the first transistor may be a fishbone-type transistor including, on an opposite side of the first input wiring, the opposite side facing away from the second transistor, a third gate electrode extending in the first direction, and a third source region and a third drain region that are arranged in the second direction with the third gate electrode being interposed between the third source region and the third drain region. The second transistor may be a fishbone-type transistor including, on an opposite side of the second input wiring, the opposite side facing away from the first transistor, a fourth gate electrode extending in the first direction, and a fourth source region and a fourth drain region that are arranged in the second direction with the fourth gate electrode being interposed between the fourth source region and the fourth drain region. The third gate electrode and the fourth gate electrode may be set to be open. The third drain region and the fourth drain region may be grounded. Accordingly, a semiconductor device having a wiring coupling section with a short electrical length can be designed and manufactured by using layout data of existing fishbone-type transistors. As a result, a design period of the semiconductor device can be shortened and the cost of the semiconductor device can be reduced.

[3] A semiconductor device according to another aspect of the present disclosure may include a first transistor including a first gate electrode extending in a first direction, and a first source region and a first drain region that are arranged in a second direction orthogonal to the first direction with the first gate electrode being interposed between the first source region and the first drain region; a second transistor arranged juxtaposed to the first transistor in the first direction and including a second gate electrode extending in the first direction, and a second source region and a second drain region that are arranged in the second direction with the second gate electrode being interposed between the second source region and the second drain region; a fishbone-type third transistor arranged between the first transistor and the second transistor and including a third gate electrode extending toward the first transistor, a third source region and a third drain region that are arranged in the second direction with the third gate electrode being interposed between the third source region and the third drain region, a fourth gate electrode extending toward the second transistor, and a fourth source region and a fourth drain region that are arranged in the second direction with the fourth gate electrode being interposed between the fourth source region and the fourth drain region; a wiring distributing section connecting an input terminal to the first gate electrode, to the second gate electrode, to the third gate electrode, and to the fourth gate electrode; a first drain wiring arranged on the first drain region and connected to the first drain region; a second drain wiring arranged on the second drain region and connected to the second drain region; a third drain wiring arranged on the third drain region and connected to the third drain region; a fourth drain wiring arranged on the fourth drain region and connected to the fourth drain region; and a wiring coupling section connecting the first drain wiring, the second drain wiring, the third drain wiring, and the fourth drain wiring to an output terminal. The first gate electrode may extend from the wiring distributing section toward the third transistor. The second gate electrode may extend from the wiring distributing section toward the third transistor.

In this semiconductor device, an electrical length of the third output wiring that connects the first output wiring, connected to the first drain region through the first drain wiring, and the second output wiring, connected to the third drain region through the third drain wiring, can be shortened. This can reduce loss of an output signal from the semiconductor device, and can increase an output power of the semiconductor device. In other words, by reducing the size of the wiring coupling section connected to the drain, which is an output part of the transistor, loss of the output signal from the semiconductor device can be reduced and the output power can be increased.

[4] In the above [3], the wiring distributing section may include a first input wiring connected to an end of the first gate electrode on a side facing away from the third transistor; a second input wiring connected to an end of the second gate electrode on a side facing away from the third transistor; a third input wiring arranged between the third drain region and the fourth drain region and connected to the third gate electrode and the fourth gate electrode; a fourth input wiring extending in the first direction and connected to the first input wiring, the second input wiring, and the third input wiring; and a fifth input wiring connecting the fourth input wiring to the input terminal. The wiring coupling section may include a first output wiring extending in the second direction, one end of the first output wiring being connected to the first drain wiring on a side facing the third transistor; a second output wiring extending in the second direction, one end of the second output wiring being connected to the third drain wiring on a side facing the first transistor; a third output wiring extending in the first direction and connected to another end of the first output wiring and another end of the second output wiring; a fourth output wiring, an end of the fourth output wiring being connected to a center portion of the third output wiring; a fifth output wiring extending in the second direction, one end of the fifth output wiring being connected to the second drain wiring on a side facing the third transistor; a sixth output wiring extending in the second direction, one end of the sixth output wiring being connected to the fourth drain wiring on a side facing the second transistor; a seventh output wiring extending in the first direction and connected to another end of the fifth output wiring and another end of the sixth output wiring; an eighth output wiring, an end of the eighth output wiring being connected to a center portion of the seventh output wiring; a ninth output wiring extending in the first direction and connected to another end of the fourth output wiring and another end of the eighth output wiring; and a tenth output wiring connecting a center portion of the ninth output wiring to the output terminal.

This can shorten an electrical length of the seventh output wiring that connects the fifth output wiring, connected to the second drain region through the second drain wiring, and the sixth output wiring, connected to the fourth drain region through the fourth drain wiring. Thus, this can reduce loss of an output signal from the semiconductor device, and can increase an output power of the semiconductor device. In other words, by reducing the size of the wiring coupling section connected to the drain, which is an output part of the transistor, loss of the output signal from the semiconductor device can be reduced and the output power can be increased.

[5] In the above [4], the fifth input wiring may include a sixth input wiring extending in the second direction, an end of the sixth input wiring being connected to a center portion between a connection portion of the first input wiring and a connection portion of the third input wiring in the fourth input wiring; a seventh input wiring extending in the second direction, an end of the seventh input wiring being connected to a center portion between a connection portion of the second input wiring and the connection portion of the third input wiring in the fourth input wiring; an eighth input wiring extending in the first direction and connected to another end of the sixth input wiring and another end of the seventh input wiring; and a ninth input wiring connecting a center portion of the eighth input wiring to the input terminal. This can minimize a phase shift between input signals supplied to gate electrodes of respective transistors.

[6] A power amplifier according to an embodiment of the present disclosure includes the semiconductor device according to any one of [1] to [5] above. When any one of the semiconductor devices is mounted on the power amplifier, for example, a communication distance of a radio signal transmitted from a transmitter on which the power amplifier is mounted can be increased. As a result, the distance between a transmitter and a receiver can be increased.

Details of Embodiments of the Present Disclosure

Specific examples of the semiconductor device according to the present disclosure will be described below with reference to the drawings. Note that the present embodiment is not limited to the following description. For example, at least one gate electrode G may be provided in one transistor region TRA, and the number of the gate electrodes G is not limited to the number illustrated in each drawing.

First Embodiment

[Layout of Semiconductor Device]

Figure 1:
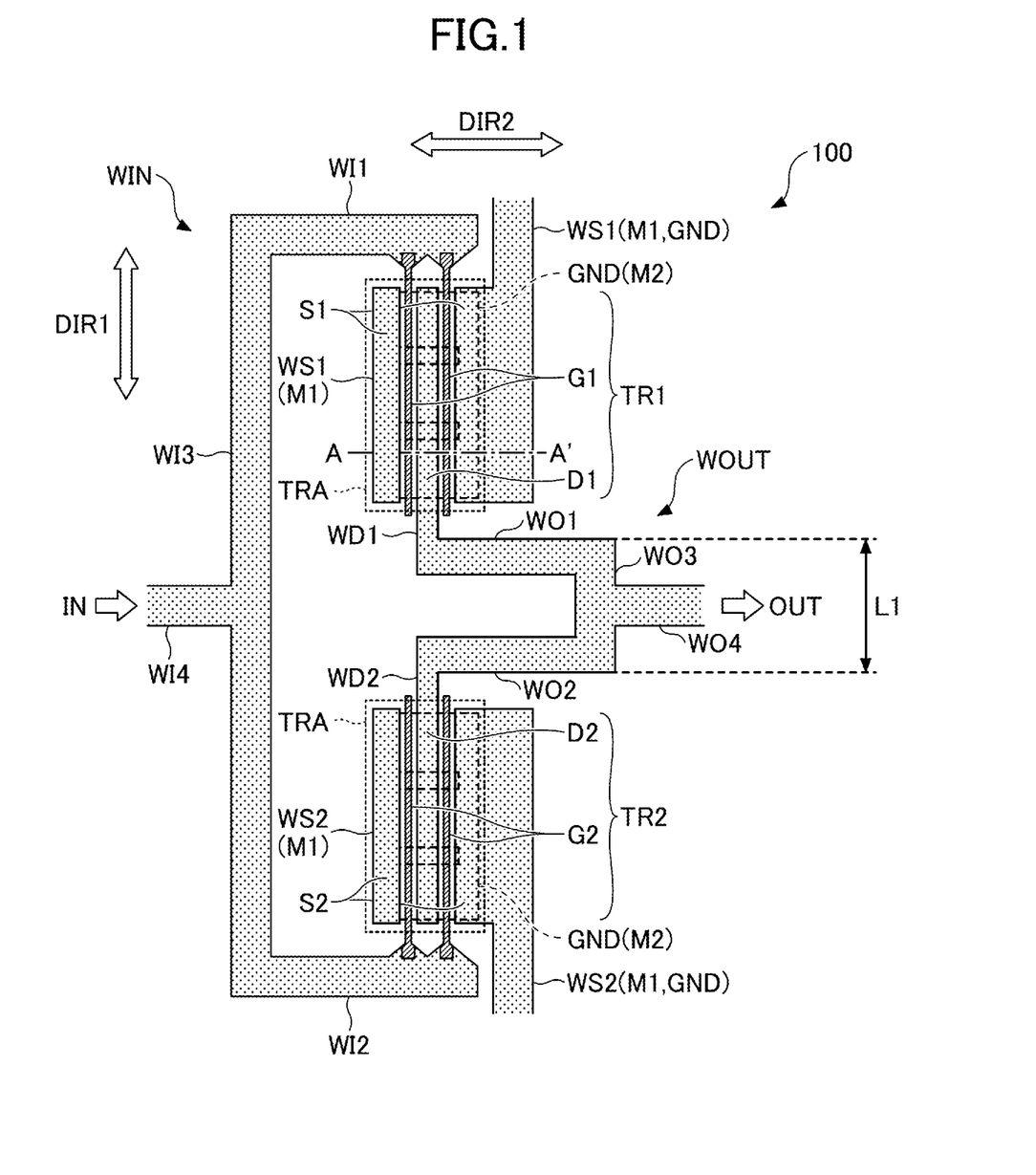
FIG. 1 is a layout diagram illustrating an example of a circuit configuration of a semiconductor device according to a first embodiment.

FIG. 1 is a layout diagram illustrating an example of a circuit configuration of a semiconductor device according to a first embodiment. For example, a semiconductor device 100 illustrated in FIG. 1 is mounted on a power amplifier for a millimeter wave band (several tens of GHz to several hundreds of GHz) and is used to amplify a power of a high-frequency signal.

Semiconductor device 100 includes transistors TR1 and TR2 that amplify a high-frequency input signal supplied to a common input terminal IN and output a high-frequency output signal obtained by amplifying the high-frequency input signal from a common output terminal OUT. For example, each of transistors TR1 and TR2 is a gallium nitride high electron mobility transistor (GaN HEMI), which is one of field effect transistors (FETs). Each of transistors TR1 and TR2 is formed in transistor region TRA indicated by a dotted rectangle. Although not particularly limited, for example, the gate length of each of transistors TR1 and TR2 is 100 nm (nanometers), and the gate width of each of transistors TR1 and TR2 is 60 μm (microns).

Transistor TR1 includes two gate electrodes G1 extending in a direction DIR1, and two source regions S1 and a drain region D1 alternately arranged in a direction DIR2 orthogonal to direction DIR1 with each of gate electrodes G1 being interposed therebetween. Direction DIR1 is an example of a first direction, and direction DIR2 is an example of a second direction. Gate electrodes G1 are formed by using a first metal wiring layer M1. In the example illustrated in FIG. 1, a common drain region D1 is formed between two gate electrodes G1, and source region S1 is formed on a side facing away from drain region D1 with respect to each of gate electrodes G1.

Drain region D1 is located in a space between two gate electrodes G1 in transistor region TRA in which transistor TR1 is famed. Source regions S1 occupy spaces exterior to the space between two gate electrodes G1 in transistor region TRA of transistor TR1. A drain wiring (drain electrode) WD1 famed by using first metal wiring layer M1 is directly connected to drain region D1. A source wiring (source electrode) WS1 formed by using first metal wiring layer M1 is directly connected to source region S1. First metal wiring layer M1 is a metal wiring layer closest to a semiconductor substrate on which semiconductor device 100 is formed.

Two source wirings WS1 formed on source regions S1 located at both ends of transistor TR1 in direction DIR2 are connected to each other through a ground wiring GND formed by using a second metal wiring layer M2. Second metal wiring layer M2 is a metal wiring layer provided on or above first metal wiring layer M1 in semiconductor device 100. Ground wiring GND famed by using second metal wiring layer M2 is indicated by a broken-line rectangle having two vacant portions inside.

Transistor TR2 includes two gate electrodes G2 extending in direction DIR1, and two source regions S2 and a drain region D2 alternately arranged in direction DIR2 with each gate electrode G2 being interposed therebetween. Gate electrode G2 is formed by using first metal wiring layer M1. As in transistor TR1, a common drain region D2 is formed between two gate electrodes G2, and source region S2 is formed on a side facing away from drain region D2 with respect to each of gate electrodes G2.

For example, transistor TR2 is arranged juxtaposed to transistor TR1 in direction DIR1. That is, each of gate electrodes G2 of transistor TR2 is formed on an extension line of each of gate electrodes G1 of transistor TR1.

Drain region D2 is formed in a space between two gate electrodes G2 in transistor region TRA in which transistor TR2 is famed. Source regions S2 occupy spaces exterior to the space between two gate electrodes G2 in transistor region TRA of transistor TR2. A drain wiring (drain electrode) WD2 famed by using first metal wiring layer M1 is directly connected to drain region D2. A source wiring (source electrode) WS2 formed by using first metal wiring layer M1 is directly connected to source region S2.

Two source wirings WS2 formed on source regions S2 located on both ends of transistor TR2 in direction DIR2 are connected to each other through ground wiring GND (a broken-line rectangle having two vacant portions inside) formed by using second metal wiring layer M2.

Gate electrodes G1 and G2 are electrically connected to a common input terminal IN through a wiring distributing section WIN. Wiring distributing section WIN includes input wirings WI1, WI2, WI3, and WI4. For example, input wirings WI1, WI2, WI3, and WI4 are formed by using first metal wiring layer M1.

One end of input wiring WI1 is connected to an end of gate electrode G1 on a side facing away from transistor TR2, and the other end of input wiring WI1 is connected to one end of input wiring WI3. One end of input wiring WI2 is connected to an end of gate electrode G2 on a side facing away from transistor TR1, and the other end of input wiring WI2 is connected to the other end of input wiring WI3.

One end of input wiring WI4 is connected to a center portion of input wiring WI3, and the other end of input wiring WI4 is electrically connected to the input terminal. Input wirings WI1, WI2, WI3, and WI4 are laid out line-symmetrically with respect to the center line of input wiring WI4 extending in direction DIR2. As a result, a high-frequency input signal received at input terminal IN can be supplied to gate electrodes G1 and G2 without being shifted in phase.

Drain wirings WD1 and WD2 are connected to a common output terminal OUT through a wiring coupling section WOUT. Wiring coupling section WOUT includes output wirings WO1, WO2, WO3, and WO4. For example, output wirings WO1, WO2, WO3, and WO4 are formed by using first metal wiring layer M1.

Output wirings WO1, WO2, and WO4 extend in direction DIR2, and output wiring WO3 extends in direction DIR1. One end of output wiring WO1 is connected to one end of drain wiring WD1 on a side facing transistor TR2. One end of output wiring WO2 is connected to one end of drain wiring WD2 on a side facing transistor TR1. Both ends of output wiring WO3 are connected to the other end of output wiring WO1 and the other end of output wiring WO2, respectively. One end of output wiring WO4 is connected to a center portion of output wiring WO3 in direction DIR1, and the other end of output wiring WO4 is electrically connected to output terminal OUT.

When two transistors TR1 and TR2 as illustrated in FIG. 1 are used to form semiconductor device 100, what is called a fishbone-type transistor is usually used. In such a case, gate electrodes G1 and G2 are directly connected to both sides of a gate wiring corresponding to a backbone portion, that is, both sides of input wiring WI1 or both sides of input wiring WI2. However, in the present embodiment, each of gate electrodes G1 in transistor TR1 is connected to a side, of input wiring WI1, facing transistor TR2, and each of gate electrodes G2 in transistor TR2 is connected to a side, of input wiring WI2, facing transistor TR1. Drain wirings WD1 and WD2 are connected to output wirings WO1 and WO2, respectively, at portions of drain wirings WD1 and WD2 that are opposed to each other in direction DIR1. In other words, gate electrodes G1 and G2 are connected to input wirings WI1 and WI2 outside the respective layout regions of transistors TR1 and TR2 in direction DIR1, respectively.

This can shorten the wiring length of wiring coupling section WOUT, and can reduce a phase shift between output signals transmitted to output wirings WO1 and WO2. In particular, an electrical length L1 that is a length of output wiring WO3 in direction DIR1 can be shortened, so that loss of the output signal from semiconductor device 100 can be reduced. As a result, the output power of semiconductor device 100 can be increased.

Further, the wiring length of wiring coupling section WOUT can be shortened, and output wirings WO1, WO2, and WO3 are laid out line-symmetrically with respect to the center line of output wiring WO4 extending in direction DIR2, so that a phase shift between high-frequency output signals respectively output from drain regions D1 and D2 can be minimized.

[Cross-Sectional Structure of Semiconductor Device]

Figure 2:
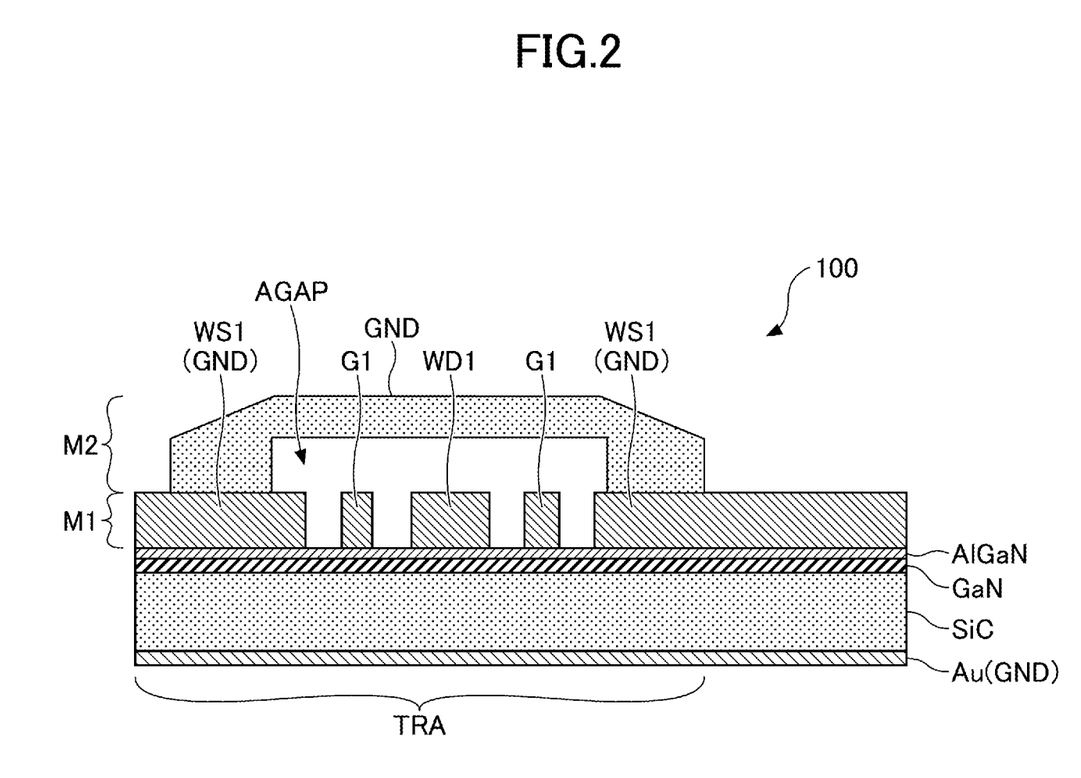
FIG. 2 is a cross-sectional view taken along a line A-A' of the semiconductor device in FIG. 1.

FIG. 2 is a cross-sectional view taken along a line A-A' of semiconductor device 100 in FIG. 1. For example, semiconductor device 100 includes a gallium nitride (GaN) layer and an aluminum gallium nitride (AlGaN) layer stacked on a silicon carbide (SiC) substrate. A gold (Au) layer is formed on a back surface of the silicon carbide substrate as a ground layer.

Gate electrodes G1, source wirings WS1, and drain wiring WD1 are formed on an uppermost aluminum gallium nitride layer by using first metal wiring layer M1. For example, gate electrodes G1, source wirings WS1 and drain wiring WD1 are formed of gold (Au). Hereinafter, source wiring WS1 in transistor region TRA is also referred to as a source electrode, and drain wiring WD1 in transistor region TRA is also referred to as a drain electrode.

Gate electrodes G1 are Schottky-connected to the aluminum gallium nitride layer. Gate electrodes G1 may have a recess structure. Source electrodes WS1 and drain electrode WD1 are in ohmic contact with the aluminum gallium nitride layer. Physically separated source wirings WS1 are connected to each other by ground wiring GND formed in second metal wiring layer M2. Ground wiring GND has what is called an air bridge wiring structure, and an air gap AGAP is formed between ground wiring GND and gate electrodes G1 and between ground wiring GND and drain wiring WD1.

[Communication System Including Semiconductor Device]

Figure 3:
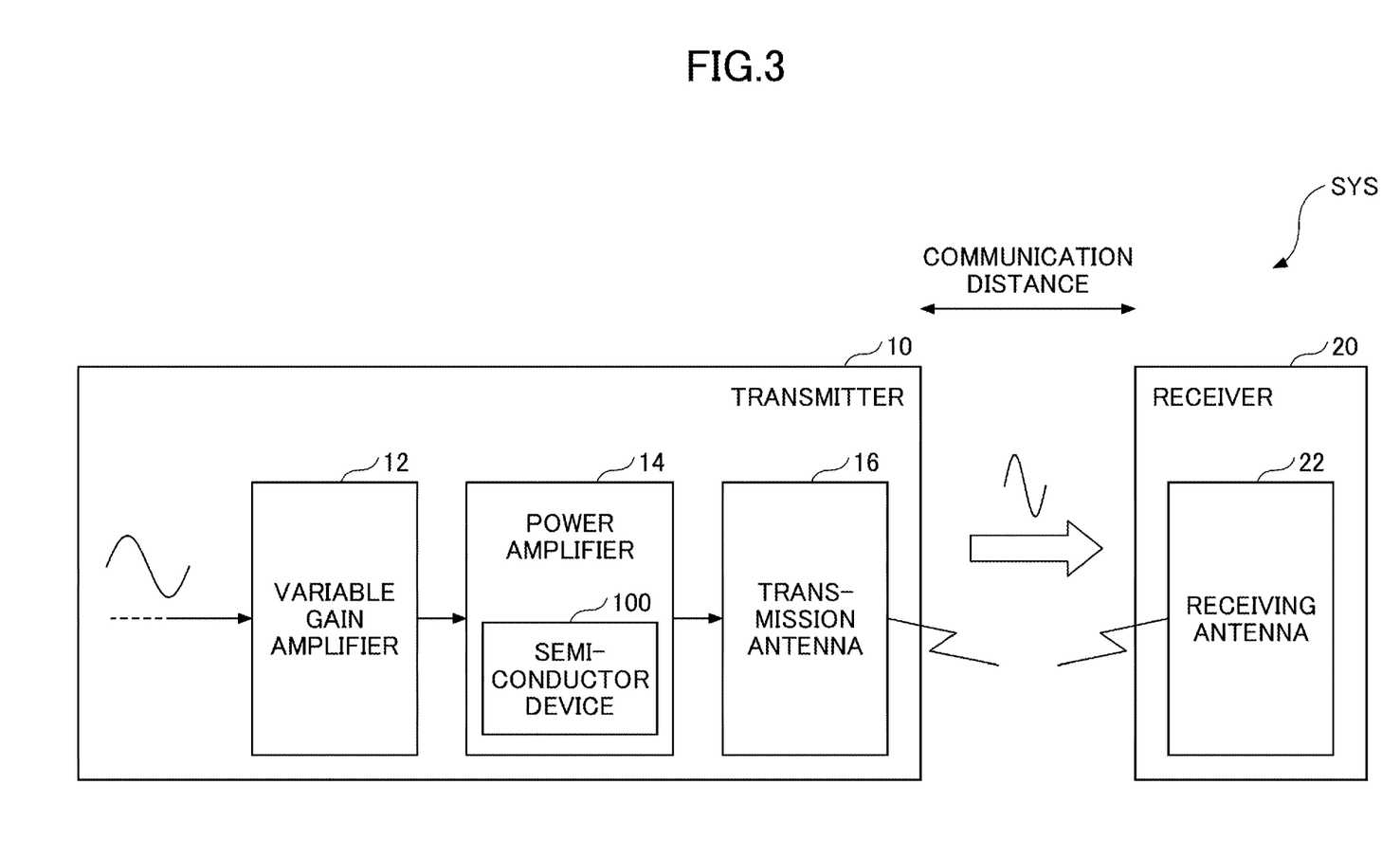
FIG. 3 is a system configuration diagram illustrating an example of a power amplifier including the semiconductor device in FIG. 1 and an example of a communication system including the power amplifier.

FIG. 3 is a system configuration diagram illustrating an example of a power amplifier including semiconductor device 100 in FIG. 1 and an example of a communication system SYS including the power amplifier. Communication system SYS includes a transmitter 10 that wirelessly transmits a high-frequency signal and a receiver 20 that receives the high-frequency signal transmitted from transmitter 10. For example, transmitter 10 and receiver 20 are mounted on base stations for mobile phones.

Transmitter 10 includes a variable gain amplifier 12, a power amplifier 14, and a transmission antenna 16. Receiver 20 includes a receiving antenna 22 and a receiving circuit (not illustrated). Variable gain amplifier 12 generates an output signal by changing a gain of an input signal in accordance with a control voltage, for example, and outputs the generated output signal to power amplifier 14.

Power amplifier 14 amplifies a power of the signal received from variable gain amplifier 12 and outputs the amplified signal to transmission antenna 16. Transmission antenna 16 converts an electric signal received from power amplifier 14 into a radio wave and transmits the radio wave to receiver 20. Receiver 20 receives the radio wave from transmitter 10 through receiving antenna 22 and performs signal processing.

In the base stations for mobile phones, as the output power of the signal transmitted by transmitter 10 is increased, the communication distance between the base stations can be increased. By increasing the communication distance, an installation interval of the base stations can be increased. Therefore, it is important to improve the output power of semiconductor device 100.

[Layout Example of Another Semiconductor Device]

Figure 4:
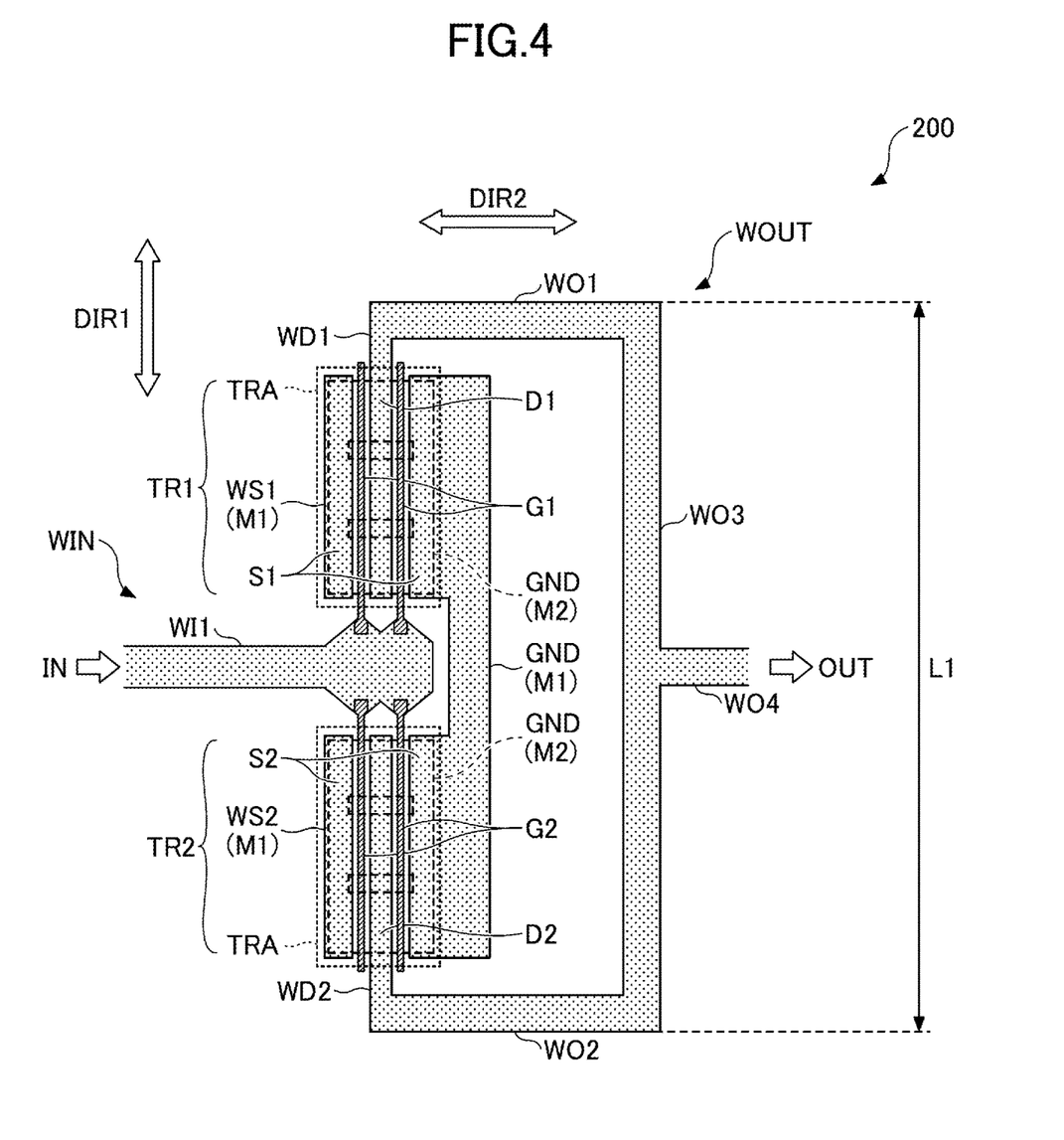
FIG. 4 is a layout diagram illustrating an example of a circuit configuration of another semiconductor device (a comparative example)

FIG. 4 is a layout diagram illustrating an example of a circuit configuration of another semiconductor device (a comparative example). Elements substantially the same as those in FIG. 1 are denoted by the same reference numerals, and detailed description thereof will be omitted. A semiconductor device 200 illustrated in FIG. 4 includes transistors TR1 and TR2 having the same sizes as those in FIG. 1. However, each of gate electrodes G1 and G2 is connected to input wiring WI1, at a center portion of semiconductor device 200 in direction DIR1. Further, drain wirings WD1 and WD2 are connected to output wirings WO1 and WO2, respectively, at both ends of semiconductor device 200 in direction DIR1. Transistors TR1 and TR2 constitute a fishbone-type transistor.

Thus, the length, in direction DIR1, of output wiring WO3 connecting output wirings WO1 and WO2 to each other is longer than that in FIG. 1, and electrical length L1 thereof is longer. Therefore, wiring coupling section WOUT of semiconductor device 200 is larger than wiring coupling section WOUT of semiconductor device 100, loss of the output signal increases, and the output power decreases.

In other words, semiconductor device 100 illustrated in FIG. 1 can reduce the size (reduce loss) of wiring coupling section WOUT by making electrical length L1 shorter than that of semiconductor device 200, thereby improving the output power of power amplifier 14 (FIG. 3). For example, compared to wiring coupling section WOUT of semiconductor device 200, wiring coupling section WOUT of semiconductor device 100 can reduce a phase shift between output signals to approximately one half, and can reduce loss of the output signals by approximately 1 dB.

With respect to the above, because wiring distributing section WIN of semiconductor device 200 is smaller than wiring distributing section WIN of semiconductor device 100, the power gain is improved, as compared to semiconductor device 100. However, the decrease in the power gain of semiconductor device 100 relative to semiconductor device 200 can be compensated by improving a gain of variable gain amplifier 12 illustrated in FIG. 3 or improving an antenna gain of transmission antenna 16, and thus does not affect the performance of communication system SYS.

As described above, in the embodiment of semiconductor device 100, drain wirings WD1 and WD2 are connected to output wiring WO1 and WO2, respectively, at the center portion of semiconductor device 100 in direction DIR1. That is, drain wirings WD1 and WD2 are routed out from a portion facing transistors TR1 and TR2. This can reduce the phase shift between output signals, and can shorten electrical length L1 that is a length of output wiring WO3 in direction DIR1, so that loss of the output signal from semiconductor device 100 can be reduced. As a result, the output power of semiconductor device 100 can be increased.

By mounting semiconductor device 100 on power amplifier 14 of transmitter 10 in communication system SYS, a communication distance from transmitter 10 to receiver 20 can be increased. For example, when transmitter 10 and receiver 20 are mounted on base stations for mobile phones, the communication distance between the base stations can be increased. As a result, an installation interval between the base stations can be increased and an equipment cost of communication system SYS can be reduced.

Second Embodiment

[Layout of Semiconductor Device]

Figure 5:
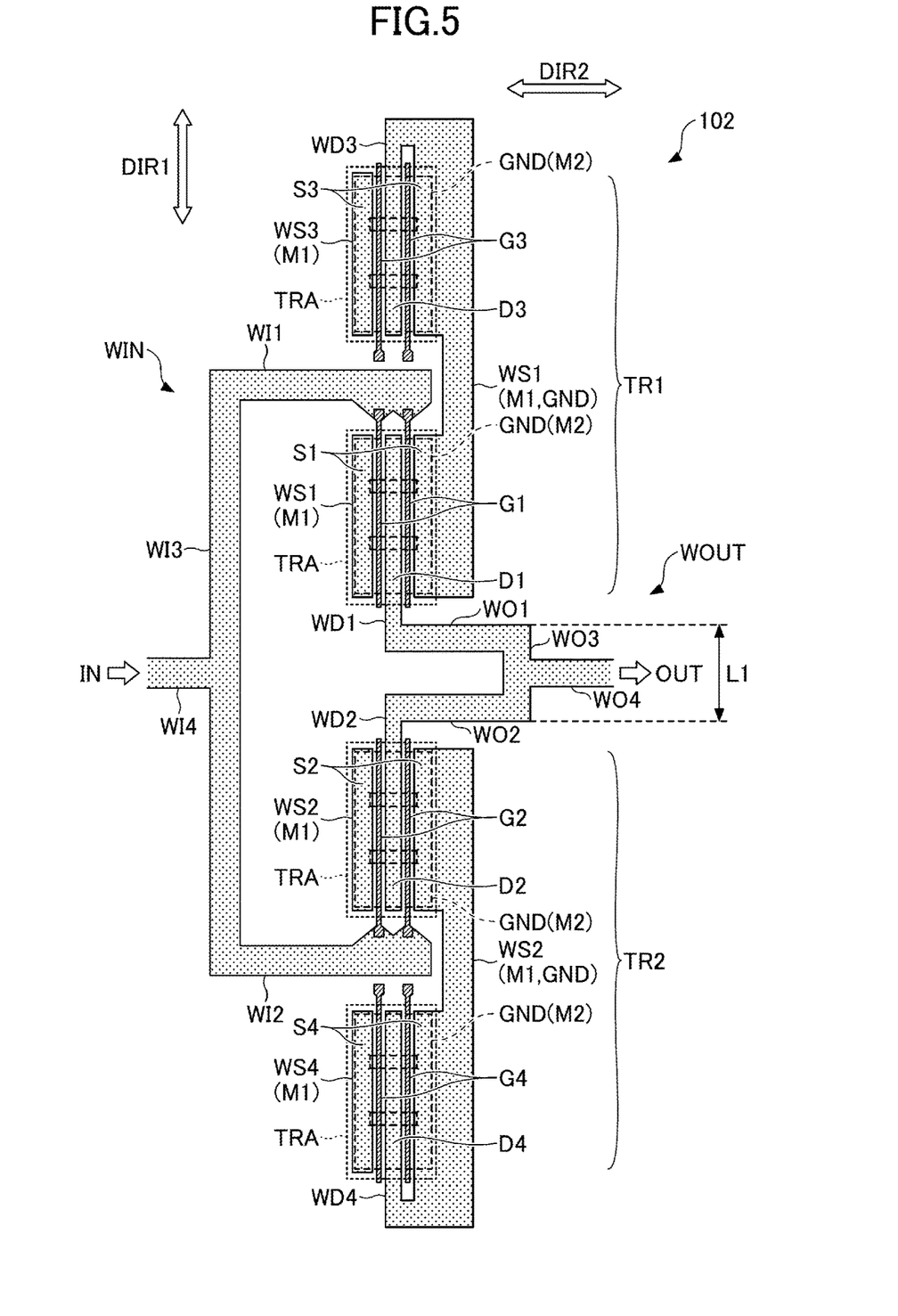
FIG. 5 is a layout diagram illustrating an example of a circuit configuration of a semiconductor device according to a second embodiment.

FIG. 5 is a layout diagram illustrating an example of a circuit configuration of a semiconductor device according to a second embodiment. Elements substantially the same as those in FIG. 1 are denoted by the same reference numerals, and detailed description thereof will be omitted. In a semiconductor device 102 illustrated in FIG. 5, each of transistors TR1 and TR2 is designed and manufactured using layout data of a fishbone-type transistor. For example, semiconductor device 102 is mounted on power amplifier 14 in FIG. 3 instead of semiconductor device 100.

Transistor TR1 includes transistor region TRA including gate electrode G1, source region S1, and drain region D1, and another transistor region TRA including a gate electrode G3, a source region S3, and a drain region D3 on a side facing away from transistor TR2 with respect to input wiring WI1.

The other transistor region TRA including gate electrode G3, source region S3, and drain region D3 is a dummy region that does not contribute to the operation of transistor TR1. For this reason, a drain wiring WD3 is connected to source wiring WS1 to be grounded, for example. Gate electrode G3 is not connected to input wiring WI1 and is set to an open state, for example. Although drain wiring WD3 is connected to source wiring WS1 in FIG. 5 for easy understanding of the description, drain wiring WD3 may be connected to ground wiring GND (M2) having the air bridge wiring structure. Further, gate electrode G3 may be connected to source wiring WS1 to be grounded. Also, drain wiring WD3 may be connected to source wiring WS1 to be grounded, and gate electrode G3 may be connected to input wiring WI1.

Transistor TR2 includes transistor region TRA including gate electrode G2, source region S2, and drain region D2, and another transistor region TRA including a gate electrode G4, a source region S4, and a drain region D4 on a side facing away from transistor TR1 with respect to input wiring WI2.

The other transistor region TRA including gate electrode G4, source region S4, and drain region D4 is a dummy region that does not contribute to the operation of transistor TR2. For this reason, a drain wiring WD4 is connected to source wiring WS2 to be grounded, for example. Gate electrode G4 is not connected to input wiring WI2 and is set to an open state, for example. Drain wiring WD4 may be connected to ground wiring GND (M2) having the air bridge wiring structure instead of being connected to source wiring WS2. Gate electrode G4 may be connected to source wiring WS2 to be grounded. Further, drain wiring WD4 may be connected to source wiring WS2 to be grounded, and gate electrode G4 may be connected to input wiring WI2.

The layout of wiring distributing section WIN and wiring coupling section WOUT is substantially the same as those in FIG. 1. Therefore, as in semiconductor device 100 illustrated in FIG. 1, in semiconductor device 102, electrical length L1 of output wiring WO3 in direction DIR1 can be shorten, and loss of an output signal from semiconductor device 102 can be reduced. As a result, an output power of semiconductor device 102 can be increased.

In communication system SYS illustrated in FIG. 3, by mounting semiconductor device 102 on power amplifier 14 of transmitter 10, a communication distance from transmitter 10 to receiver 20 can be increased. For example, when transmitter 10 and receiver 20 are mounted on base stations for mobile phones, the communication distance between the base stations can be increased. As a result, an installation interval between the base stations can be increased and an equipment cost of communication system SYS can be reduced.

As described above, also in this embodiment, the same effects as those of the above-described embodiment can be obtained. Further, in this embodiment, semiconductor device 102 in which electrical length L1 of wiring coupling section WOUT is small can be designed and manufactured by using layout data of the existing fishbone-type transistors. As a result, the design period of semiconductor device 102 can be shortened, and the cost of semiconductor device 102 can be reduced.

Third Embodiment

[Layout of Semiconductor Device]

Figure 6:
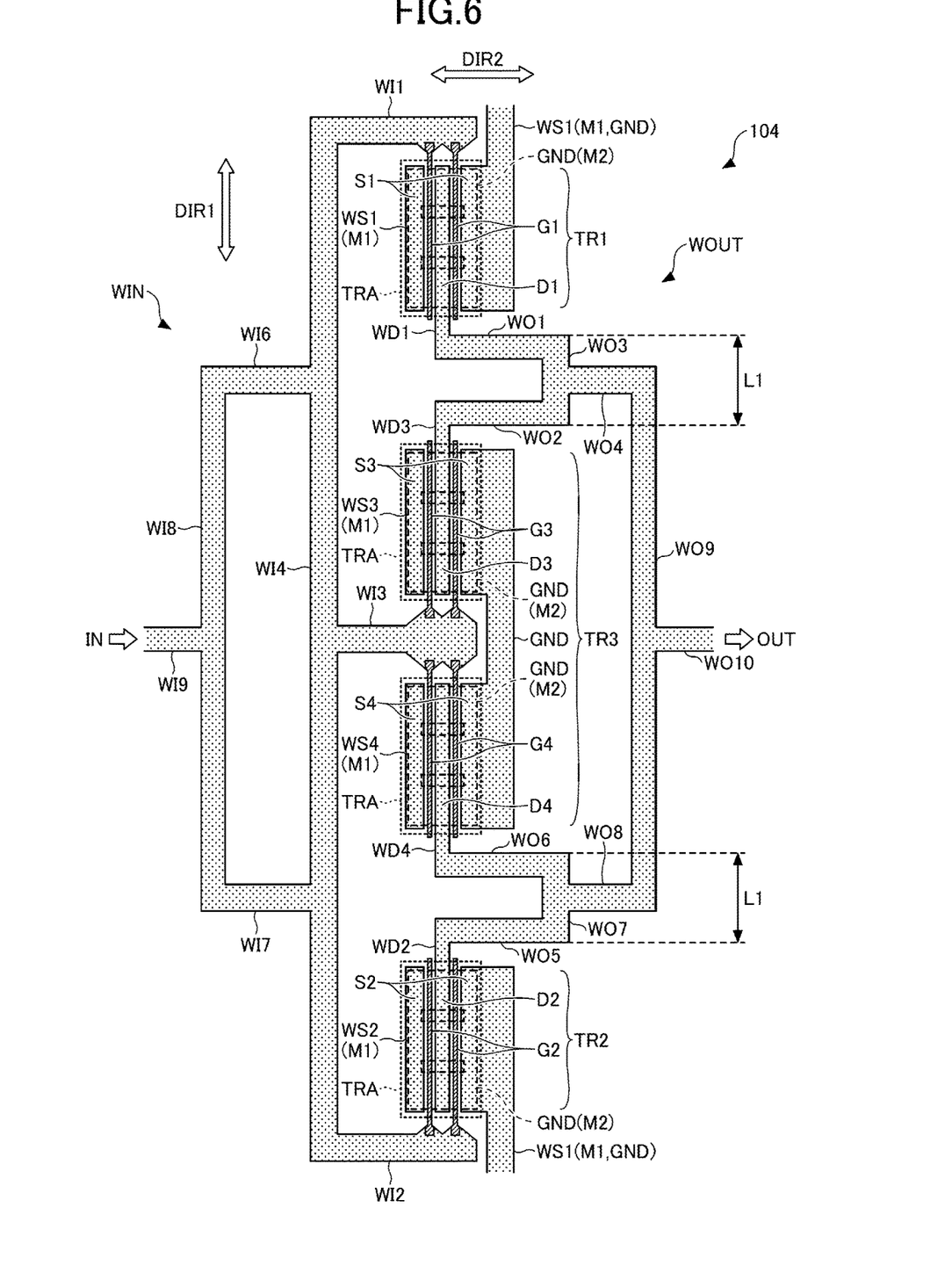
FIG. 6 is a layout diagram illustrating an example of a circuit configuration of a semiconductor device according to a third embodiment.

FIG. 6 is a layout diagram illustrating an example of a circuit configuration of a semiconductor device according to a third embodiment. Elements substantially the same as those in FIGS. 1 and 5 are denoted by the same reference numerals, and detailed description thereof will be omitted. In a semiconductor device 104 illustrated in FIG. 6, a fishbone-type transistor TR3 is arranged between transistors TR1 and TR2 having the same configurations as those in FIG. 1. For example, semiconductor device 104 is mounted on power amplifier 14 in FIG. 3 instead of semiconductor device 100. The total gate width of semiconductor device 104 is twice the total gate width of semiconductor device 100 in FIG. 1.

Transistor TR3 includes gate electrodes G3 and G4, source regions S3 and S4, and drain regions D3 and D4. Source region S3 is connected to a source wiring WS3. Source region S4 is connected to a source wiring WS4. Drain region D3 is connected to drain wiring WD3. Drain region D4 is connected to drain wiring WD4.

Gate electrodes G1, G2, G3, and G4 are electrically connected to a common input terminal IN through wiring distributing section WIN. Wiring distributing section WIN includes input wirings WI1, WI2, WI3, WI4, WI6, WI7, WI8, and WI9. One end of input wiring WI1 is connected to an end of gate electrode G1 on a side facing away from transistor TR3, and the other end of input wiring WI1 is connected to one end of input wiring WI4.

One end of input wiring WI2 is connected to an end of gate electrode G2 on a side facing away from transistor TR3, and the other end of input wiring WI2 is connected to the other end of input wiring WI4. One end of input wiring WI3 is connected to gate electrodes G3 and G4 at portions of gate electrodes G3 and G4 that are opposed to each other, and the other end of input wiring WI3 is connected to a center portion of input wiring WI4 in direction DIR1.

One end of input wiring WI6 is connected to a center portion between a connection portion of input wiring WI1 and a connection portion of input wiring WI3 in input wiring WI4. One end of input wiring WI7 is connected to a center portion between a connection portion of input wiring WI2 and the connection portion of input wiring WI3 in input wiring WI4. Input wiring WI8 is connected to the other end of input wiring WI6 and the other end of the input wiring WI7. Input wiring WI9 electrically connects a center portion of input wiring WI8 in direction DIR1 to input terminal IN.

When input signals are supplied to gate electrodes G1, G2, G3, and G4 of transistors TR1, TR2, and TR3 through three input wirings WI1, WI2, and WI3, a wiring layout of wiring distribution section WIN illustrated in FIG. 6 can minimize a phase shift between input signals supplied to gate electrodes G1, G2, G3, and G4.

Drain wirings WD1, WD2, WD3 and WD4 are electrically connected to a common output terminal OUT through wiring coupling section WOUT. Wiring coupling section WOUT includes output wirings WO1, WO2, WO3, WO4, WO5, WO6, WO7, WO8, WO9, and WO10.

One end of output wiring WO1 is connected, in direction DIR2, to an end of drain wiring WD1 on a side facing transistor TR3. One end of output wiring WO2 is connected, in direction DIR2, to an end of drain wiring WD3 on a side facing transistor TR1. Output wiring WO3 is connected to the other end of output wiring WO1 and the other end of output wiring WO2 in direction DIR1. One end of output wiring WO4 is connected to a center portion of output wiring WO3 in direction DIR1.

One end of output wiring WO5 is connected, in direction DIR2, to an end of drain wiring WD2 on a side facing transistor TR3. One end of output wiring WO6 is connected, in direction DIR2, to an end of drain wiring WD4 on a side facing transistor TR2. Output wiring WO7 is connected to the other end of output wiring WO5 and the other end of output wiring WO6 in direction DIR1. One end of output wiring WO8 is connected to a center portion of output wiring WO7 in direction DIR1. Output wiring WO9 is connected to the other end of output wiring WO4 and the other end of output wiring WO8 in direction DIR1. Output wiring WO10 electrically connects a center portion of output wiring WO9 in direction DIR1 to output terminal OUT.

In this embodiment, as in FIG. 1, drain wirings WD1 and WD3 are connected to output wirings WO1 and WO2, respectively, at portions of drain wirings WD1 and WD3 that are opposed to each other. Further, drain wirings WD2 and WD4 are connected to output wirings WO5 and WO6, respectively, at portions of drain wirings WD2 and WD4 that are opposed to each other. This can shorten electrical length L1 of each of output wirings WO3 and WO7 in direction DIR1. As a result, as in semiconductor device 100 in FIG. 1, loss of the output signal from semiconductor device 104 can be reduced, and the output power of semiconductor device 104 can be increased. As described above, also in this embodiment, substantially the same effects as those of the above-described embodiments can be obtained.

[Layout Example of Another Semiconductor Device]

Figure 7:
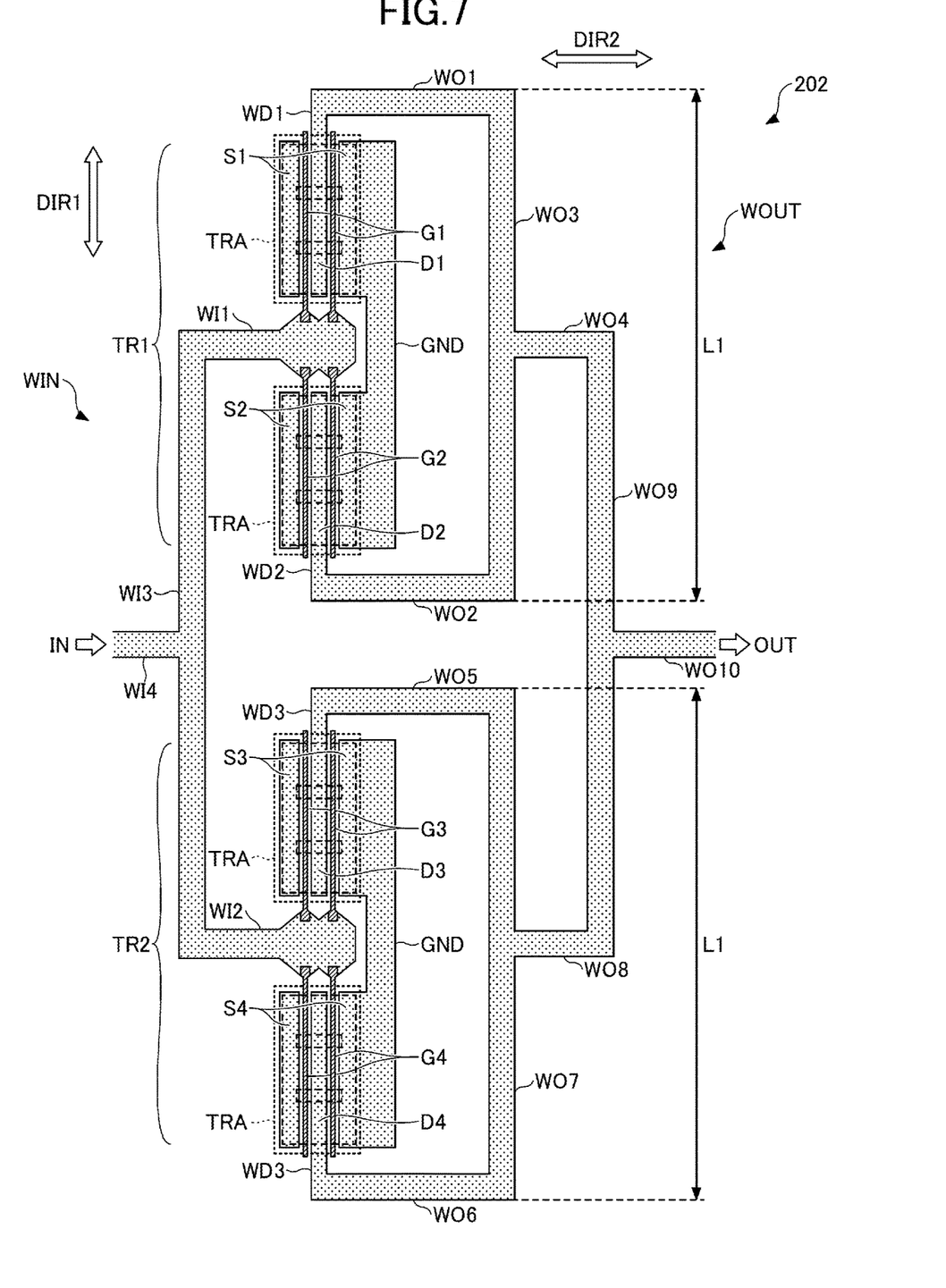
FIG. 7 is a layout diagram illustrating an example of a circuit configuration of another semiconductor device (a comparative example).

FIG. 7 is a layout diagram illustrating an example of a circuit configuration of another semiconductor device (a comparative example). Elements substantially the same as those in FIGS. 1, 4, and 6 are denoted by the same reference numerals, and detailed description thereof will be omitted. A semiconductor device 202 illustrated in FIG. 7 includes two fishbone-type transistors TR1 and TR2 arranged in direction DIR1. Configurations of transistors TR1 and TR2 are substantially the same as the configuration of transistor TR3 illustrated in FIG. 6. The total gate width of semiconductor device 202 is equal to the total gate width of semiconductor device 104 in FIG. 6.

A layout of transistor TR1, and a layout of input wiring WI1 and output wirings WO1, WO2, WO3, and WO4 that are connected to transistor TR1 are substantially the same as the layout of semiconductor device 200 illustrated in FIG. 4. A layout of transistor TR2, and a layout of input wiring WI2 and output wirings WO5, WO6, WO7, and WO8 that are connected to transistor TR2 are substantially the same as the layout of semiconductor device 200 illustrated in FIG. 4.

One end of input wiring WI1 is connected to gate electrodes G1 and G2, and the other end of input wiring WI1 is connected to one end of input wiring WI3. One end of input wiring WI2 is connected to gate electrodes G3 and G4, and the other end of input wiring WI2 is connected to the other end of input wiring WI3. A center portion of input wiring WI3 in direction DIR1 is electrically connected to input terminal IN through input wiring WI4.

One end of output wiring WO1 is connected to drain wiring WD1 at the outer side of semiconductor device 202 in direction DIR1, and the other end of output wiring WO1 is connected to one end of output wiring WO3. One end of output wiring WO2 is connected to drain wiring WD2 at a center portion of semiconductor device 202 in direction DIR1, and the other end of output wiring WO2 is connected to the other end of output wiring WO3. A center portion of output wiring WO3 in direction DIR1 is connected to one end of output wiring WO4.

One end of output wiring WO5 is connected to drain wiring WD3 at a center portion of semiconductor device 202 in direction DIR1, and the other end of output wiring WO5 is connected to one end of output wiring WO7. One end of output wiring WO6 is connected to drain wiring WD3 at the outer side of semiconductor device 202 in direction DIR1, and the other end of output wiring WO6 is connected to the other end of output wiring WO7. A center portion of output wiring WO7 in direction DIR1 is connected to one end of output wiring WO8.

The other end of output wiring WO4 is connected to one end of output wiring WO9. The other end of output wiring WO8 is connected to the other end of output wiring WO9. A center portion of output wiring WO9 in direction DIR1 is electrically connected to output terminal OUT through output wiring WO10.

In semiconductor device 202, the length of each of output wirings WO3 and WO7 in direction DIR1 is longer than that of each of output wirings WO3 and WO7 illustrated in FIG. 6, and thus electrical length L1 of each of output wirings WO3 and WO7 in direction DIR1 is longer than that of each of output wirings WO3 and WO7 illustrated in FIG. 6. Therefore, wiring coupling section WOUT of semiconductor device 202 is larger than wiring coupling section WOUT of semiconductor device 104 of FIG. 6, and loss of the output signal increases, so that the output power decreases.

In other words, in semiconductor device 104 illustrated in FIG. 6, the size of wiring coupling section WOUT can be reduced (loss can be reduced) by shortening electrical length L1 in direction DIR1, as compared to semiconductor device 202, so that the output power can be improved. For example, compared to wiring coupling section WOUT of semiconductor device 202, wiring coupling section WOUT of semiconductor device 104 can reduce a phase shift between output signals to approximately one half, and can reduce loss by approximately 1 dB.

With respect to the above, wiring distributing section WIN of semiconductor device 202 can be made smaller than wiring distributing section WIN of semiconductor device 104, so that the power gain is improved as compared with semiconductor device 104. However, the decrease in the power gain of semiconductor device 104 relative to semiconductor device 202 can be compensated by improving a gain of variable gain amplifier 12 illustrated in FIG. 3 or improving an antenna gain of transmission antenna 16, and thus does not affect the performance of communication system SYS. As described above, also in this embodiment, substantially the same effects as those of the above-described embodiment can be obtained.

Although the embodiments and the like of the present disclosure have been described above, the present disclosure is not limited to the above-described embodiments and the like. Various changes, modifications, substitutions, additions, deletions, and combinations are possible within the scope of the claims. These also naturally fall within the technical scope of the present disclosure.

What is claimed is:

1. A semiconductor device comprising:
    a first transistor including a first gate electrode, a first source region, and a first drain region, the first gate electrode extending in a first direction, the first source region and the first drain region being arranged in a second direction with the first gate electrode being interposed between the first source region and the first drain region, and the second direction being orthogonal to the first direction;
    a second transistor arranged juxtaposed to the first transistor in the first direction and including a second gate electrode, a second source region, and a second drain region, the second gate electrode extending in the first direction, the second source region and the second drain region being arranged in the second direction with the second gate electrode being interposed between the second source region and the second drain region;
    a wiring distributing section connecting an input terminal to the first gate electrode and to the second gate electrode;
    a first drain wiring arranged on the first drain region and connected to the first drain region;
    a second drain wiring arranged on the second drain region and connected to the second drain region; and a wiring coupling section connecting the first drain wiring and the second drain wiring to an output terminal,
wherein the wiring distributing section includes:
a first input wiring connected to an end of the first gate electrode on a side facing away from the second transistor;
a second input wiring connected to an end of the second gate electrode on a side facing away from the first transistor; and
a third input wiring connecting the first input wiring and the second input wiring to the input terminal, and
the wiring coupling section includes:
a first output wiring extending in the second direction, one end of the first output wiring being connected to the first drain wiring on a side facing the second transistor;
a second output wiring extending in the second direction, one end of the second output wiring being connected to the second drain wiring on a side facing the first transistor;
a third output wiring extending in the first direction and connected to another end of the first output wiring and another end of the second output wiring; and
a fourth output wiring connecting a center portion of the third output wiring to the output terminal.

2. The semiconductor device according to claim 1,
wherein the first transistor is a fishbone-type transistor including a third gate electrode, a third source region, and a third drain region on an opposite side of the first input wiring, the opposite side of the first input wiring facing away from the second transistor, the third gate electrode extending in the first direction, the third source region and the third drain region being arranged in the second direction with the third gate electrode being interposed between the third source region and the third drain region,
the second transistor is a fishbone-type transistor including a fourth gate electrode, a fourth source region, and a fourth drain region on an opposite side of the second input wiring, the opposite side of the second input wiring facing away from the first transistor, the fourth gate electrode extending in the first direction, the fourth source region and the fourth drain region being arranged in the second direction with the fourth gate electrode being interposed between the fourth source region and the fourth drain region,
the third gate electrode and the fourth gate electrode are set to be open, and
the third drain region and the fourth drain region are grounded.

3. A semiconductor device comprising:
a first transistor including a first gate electrode, a first source region, and a first drain region, the first gate electrode extending in a first direction, the first source region and the first drain region being arranged in a second direction with the first gate electrode being interposed between the first source region and the first drain region, the second direction being orthogonal to the first direction;
a second transistor arranged juxtaposed to the first transistor in the first direction and including a second gate electrode, a second source region, and a second drain region, the second gate electrode extending in the first direction, and the second source region and the second drain region being arranged in the second direction with the second gate electrode being interposed between the second source region and the second drain region;
a third transistor arranged between the first transistor and the second transistor and including a third gate electrode, a third source region, a third drain region, a fourth gate electrode, a fourth source region, and a fourth drain region, the third gate electrode extending toward the first transistor, the third source region and the third drain region being arranged in the second direction with the third gate electrode being interposed between the third source region and the third drain region, the fourth gate electrode extending toward the second transistor, the fourth source region and the fourth drain region being arranged in the second direction with the fourth gate electrode being interposed between the fourth source region and the fourth drain region, and the third transistor being a fishbone-type transistor;
a wiring distributing section connecting an input terminal to the first gate electrode, to the second gate electrode, to the third gate electrode, and to the fourth gate electrode;
a first drain wiring arranged on the first drain region and connected to the first drain region;
a second drain wiring arranged on the second drain region and connected to the second drain region;
a third drain wiring arranged on the third drain region and connected to the third drain region;
a fourth drain wiring arranged on the fourth drain region and connected to the fourth drain region; and
a wiring coupling section connecting the first drain wiring, the second drain wiring, the third drain wiring, and the fourth drain wiring to an output terminal,
wherein the first gate electrode extends from the wiring distributing section toward the third transistor, and
the second gate electrode extends from the wiring distributing section toward the third transistor.

4. The semiconductor device according to claim 3,
wherein the wiring distributing section includes:
a first input wiring connected to an end of the first gate electrode on a side facing away from the third transistor;
a second input wiring connected to an end of the second gate electrode on a side facing away from the third transistor;
a third input wiring arranged between the third drain region and the fourth drain region and connected to the third gate electrode and the fourth gate electrode;
a fourth input wiring extending in the first direction and connected to the first input wiring, the second input wiring, and the third input wiring; and
a fifth input wiring connecting the fourth input wiring to the input terminal, and
the wiring coupling section includes:
a first output wiring extending in the second direction, one end of the first output wiring being connected to the first drain wiring on a side facing the third transistor;
a second output wiring extending in the second direction, one end of the second output wiring being connected to the third drain wiring on a side facing the first transistor;
a third output wiring extending in the first direction and connected to another end of the first output wiring and another end of the second output wiring;

a fourth output wiring, an end of the fourth output wiring being connected to a center portion of the third output wiring;

a fifth output wiring extending in the second direction, one end of the fifth output wiring being connected to the second drain wiring on a side facing the third transistor;

a sixth output wiring extending in the second direction, one end of the sixth output wiring being connected to the fourth drain wiring on a side facing the second transistor;

a seventh output wiring extending in the first direction and connected to another end of the fifth output wiring and another end of the sixth output wiring;

an eighth output wiring, an end of the eighth output wiring being connected to a center portion of the seventh output wiring;

a ninth output wiring extending in the first direction and connected to another end of the fourth output wiring and another end of the eighth output wiring; and a tenth output wiring connecting a center portion of the ninth output wiring to the output terminal.

5. The semiconductor device according to claim 4, wherein the fifth input wiring includes:

a sixth input wiring, one end of the sixth input wiring being connected to a center portion between a connection portion of the first input wiring and a connection portion of the third input wiring in the fourth input wiring, and the sixth input wiring extending in the second direction;

a seventh input wiring, one end of the seventh input wiring being connected to a center portion between a connection portion of the second input wiring and the connection portion of the third input wiring in the fourth input wiring, and the seventh input wiring extending in the second direction;

an eighth input wiring extending in the first direction and connected to another end of the sixth input wiring and another end of the seventh input wiring; and a ninth input wiring connecting a center portion of the eighth input wiring to the input terminal.

6. A power amplifier comprising
the semiconductor device according to claim 1.

* * * * *